(12) United States Patent
Naono et al.

(10) Patent No.: US 8,390,178 B2
(45) Date of Patent: Mar. 5, 2013

(54) PIEZOELECTRIC FILM AND PIEZOELECTRIC DEVICE

(75) Inventors: Takayuki Naono, Kanagawa-ken (JP); Takami Arakawa, Kanagawa-ken (JP)

(73) Assignee: FUJIFILM Corporation, Tokyo (JP)

(*) Notice: Subject to any disclaimer, the term of this patent is extended or adjusted under 35 U.S.C. 154(b) by 73 days.

(21) Appl. No.: 13/168,011

(22) Filed: Jun. 24, 2011

(65) Prior Publication Data

US 2011/0316393 A1 Dec. 29, 2011

(30) Foreign Application Priority Data

Jun. 25, 2010 (JP) ................. 2010-145101

(51) Int. Cl.
*H01L 41/08* (2006.01)
(52) U.S. Cl. ................. 310/358; 252/62.9 PZ
(58) Field of Classification Search .......... 310/311, 310/366, 365, 358, 357, 363, 322; 252/62.9 PZ, 252/62.9 R; 501/134; *H01L 41/09, 41/08*
See application file for complete search history.

(56) References Cited

U.S. PATENT DOCUMENTS

| 4,281,701 A * | 8/1981 | Ross ........................ 152/158 |
| 5,648,012 A * | 7/1997 | Higashibeppu et al. .............. 252/62.9 PZ |
| 2006/0216549 A1 * | 9/2006 | Kijima et al. ................. 428/701 |
| 2009/0230346 A1 | 9/2009 | Hamada et al. |

FOREIGN PATENT DOCUMENTS

JP 2009-221037 A 10/2009

* cited by examiner

*Primary Examiner* — Thomas Dougherty
*Assistant Examiner* — Karen B Addison
(74) *Attorney, Agent, or Firm* — Birch, Stewart, Kolasch & Birch, LLP (57) ABSTRACT

A piezoelectric film includes crystals of a complex oxide having a perovskite structure with (100)-preferred orientation and represented as: $Pb_{1+\delta}[(Zr_xTi_{1-x})_{1-y}Nb_y]O_z$, where x is a value in a range of $0<x<1$, y is a value in a range of $0.13 \leq y \leq 0.25$, and $\delta$ and z are values within ranges where the perovskite structure is obtained and $\delta=0$ and $z=3$ are standard, wherein a ratio between a diffraction peak intensity I(100) from a perovskite (100) plane and a diffraction peak intensity I(200) from a perovskite (200) plane as measured by X-ray diffraction satisfies $I(100)/I(200) \geq 1.25$.

10 Claims, 10 Drawing Sheets

| | Nb(%) | I(100)/I(200) | ε | d₃₁(pm/V) | DRIVE DURABILITY | APPARATUS | Vsub |
|---|---|---|---|---|---|---|---|
| PRACTICAL EXAMPLE1 | 19.4 | 1.29 | 1280 | 310 | B | FIG.2 | +5V |
| PRACTICAL EXAMPLE2 | 22.6 | 1.305 | 1318 | 258 | A | FIG.2 | +6V |
| PRACTICAL EXAMPLE3 | 13 | 1.859 | 1196 | 230 | B | FIG.2 | +5V |
| PRACTICAL EXAMPLE4 | 13.5 | 1.56 | 1143 | 230 | B | FIG.2 | +7V |
| COMPARATIVE EXAMPLE1 | 11.2 | 2.83 | 1069 | 220 | A | FIG.2 | +7V |
| COMPARATIVE EXAMPLE2 | 20.7 | 1.071 | 992.8 | 210 | C | FIG.4 | +16V |
| COMPARATIVE EXAMPLE3 | 17.8 | 1.17 | 937 | 196 | C | FIG.4 | +20V |
| COMPARATIVE EXAMPLE4 | 9.4 | 2.04 | 914 | 193 | — | FIG.2 | +7V |
| COMPARATIVE EXAMPLE5 | 6.8 | 1.3 | 816 | 146 | — | FIG.2 | — |
| COMPARATIVE EXAMPLE6 | 0 | 1.26 | 700 | 130 | — | FIG.2 | — |
| COMPARATIVE EXAMPLE7 | 14 | 1.08 | 870 | 170 | C | FIG.4 | +18V |

PIEZOELECTRIC FILM AND PIEZOELECTRIC DEVICE

BACKGROUND OF THE INVENTION

1. Field of the Invention

The present invention relates to a piezoelectric film and a piezoelectric device, and more particularly to a piezoelectric film and a piezoelectric device having high piezoelectric performance.

2. Description of the Related Art

There has been known a piezoelectric device that is obtained by combining a piezoelectric film having a piezoelectric property of producing displacement due to application of a drive voltage, with electrodes through which the drive voltage is applied to the piezoelectric film. A piezoelectric film is a thin film, which is beneficial for achieving greater fineness and is therefore extremely useful, but does not have good piezoelectric performance and is therefore problematic in that it cannot yield sufficient device performance.

Known piezoelectric materials are PZT (lead zirconate titanate), or substituted PZT in which a portion of the A or B site of the PZT is substituted with another element. It is known that PZT that is doped with donor ions having higher valence than the valence of the substituted ions has improved piezoelectric performance compared to pure PZT.

For example, Japanese Patent Application Publication No. 2009-221037 discloses a piezoelectric film in which the B site atoms are substituted with Ta or Nb in a range of 5% to 20%, and $SiO_2$ or $GeO_2$ is included as an additive.

SUMMARY OF THE INVENTION

In recent years, there have been increasing demands for piezoelectric films having high piezoelectric performance.

The present invention has been contrived in view of these circumstances, an object thereof being to provide a piezoelectric film and a piezoelectric device having higher piezoelectric performance.

In order to attain the aforementioned object, the present invention is directed to a piezoelectric film comprising crystals of a complex oxide having a perovskite structure with (100)-preferred orientation and represented as: $Pb_{1+\delta}[(Zr_xTi_{1-x})_{1-y}Nb_y]O_z$, where x is a value in a range of $0<x<1$, y is a value in a range of $0.13 \leq y \leq 0.25$, and $\delta$ and z are values within ranges where the perovskite structure is obtained and $\delta=0$ and $z=3$ are standard, wherein a ratio between a diffraction peak intensity I(100) from a perovskite (100) plane and a diffraction peak intensity I(200) from a perovskite (200) plane as measured by X-ray diffraction satisfies $I(100)/I(200) \geq 1.25$.

According to this aspect of the present invention, since the amount of Nb is not less than 13%, it is possible to improve piezoelectric characteristics and dielectric characteristics. Moreover, it can be confirmed that by satisfying $I(100)/I(200) \geq 1.25$, Pb is situated in the effective position inside the perovskite lattice, and sufficient piezoelectric performance can be obtained. Furthermore, by satisfying the ratio of $I(100)/I(200) \geq 1.25$, it is possible to reduce the amount of unstable Pb ions in the crystal, and therefore continuous drive durability can be improved.

Preferably, the ratio between the diffraction peak intensity I(100) and the diffraction peak intensity I(200) satisfies $I(100)/I(200) \geq 1.29$. More preferably, y is in a range of $0.19 \leq y \leq 0.25$.

According to these aspects of the present invention, by making the doping amount of Nb not less than 19%, and by further making the ratio of I(100)/I(200) not less than 1.29, it is possible to provide a piezoelectric film having even higher piezoelectric characteristics and dielectric characteristics.

Preferably, crystalline phases of the piezoelectric film include a rhombohedral phase. Although the spontaneous polarization of the rhombohedral phase is in the (111) direction, it is known that a large piezoelectric constant is produced if an electric field is applied in the (100) direction.

According to this aspect of the present invention, since the crystalline phases of the piezoelectric film include the rhombohedral phase, then it is possible to provide the piezoelectric film having higher piezoelectric performance due to effects such as that described above.

Preferably, a thickness of the piezoelectric film is not smaller than 2 μm.

According to this aspect of the present invention, by limiting the ratio of I(100)/I(200), and by further making the film thickness large, it is possible to further improve the continuous drive durability.

Preferably, the piezoelectric film has a piezoelectric constant $d_{31}$ of not smaller than 220 pm/V, and more preferably not smaller than 250 pm/V.

According to these aspects of the present invention, since the piezoelectric constant $d_{31}$ of the piezoelectric film is not smaller than 200 pm/V, and more preferably not smaller than 250 pm/V, then it is possible to obtain sufficient piezoelectric performance.

Preferably, the piezoelectric film has a columnar crystal structure extending in a thickness direction of the piezoelectric film.

According to this aspect of the present invention, since the crystalline structure of the piezoelectric film is a columnar crystalline structure extending in the thickness direction of the piezoelectric film, then it is possible to form the piezoelectric film having a large thickness.

Preferably, the piezoelectric film is formed by a sputtering process.

According to this aspect of the present invention, since the piezoelectric film is formed by the sputtering process, then it is possible to prevent the occurrence of lateral stripes caused by layered crystallization, and durability can be improved.

In order to attain the aforementioned object, the present invention is also directed to a piezoelectric device, comprising: the piezoelectric film as described above; and electrodes through which an electric field is applied to the piezoelectric film.

According to this aspect of the present invention, it is possible to provide a piezoelectric device having high piezoelectric performance by using the piezoelectric film according to the present invention.

According to the piezoelectric film of the present invention, since Nb is contained at a rate of no less than 13% and the diffraction peak intensity ratio from the (100) surface and the (200) surface is no less than a prescribed value, then it is possible to obtain sufficient piezoelectric performance. Furthermore, by using the piezoelectric film according to the present invention in a piezoelectric device, it is possible to provide the piezoelectric device having sufficient performance.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

Piezoelectric Device and Inkjet Recording Head

Figure 1:
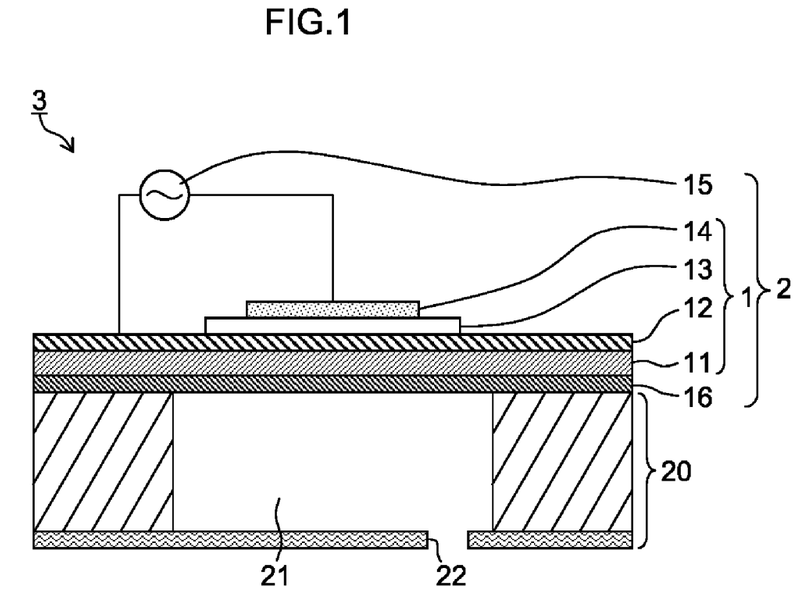
FIG. 1 is a cross-sectional diagram showing the structure of a piezoelectric device and an inkjet recording head including a piezoelectric film according to an embodiment of the present invention.

A structure of a piezoelectric device having a piezoelectric film according to an embodiment of the present invention and a structure of an inkjet recording head are described with reference to FIG. 1. FIG. 1 is a cross-sectional diagram showing substantial parts of the inkjet recording head. In order to facilitate visualization of the components of the inkjet recording head, the scales of the components in the drawing are made different appropriately to each other.

Schematically, the inkjet recording head 3 of the present embodiment includes a piezoelectric actuator 2 and an ink nozzle (liquid storing and ejecting member) 20 attached to a lower side of the piezoelectric actuator 2 in the drawing. The ink nozzle 20 has an ink chamber (liquid storing chamber) 21, which stores ink, and an ink ejection port (liquid ejection port) 22, through which the ink ejected from the ink chamber 21 to the outside.

In the inkjet recording head 3, the intensity of an electric field applied to a piezoelectric device 1 is changed so as to expand or contract the piezoelectric device 1, and thereby the ejection timing and the ejection amount of the ink from the ink chamber 21 are controlled.

The piezoelectric actuator 2 is formed by attaching a diaphragm 16 to a lower surface of a substrate 11 of the piezoelectric device 1 in the drawing. The diaphragm 16 vibrates as a piezoelectric film 13 expands and contracts.

In place of attaching the diaphragm 16 and the ink nozzle 20 as the members independent from the substrate 11, a part of the substrate 11 can be processed into the diaphragm 16 and the ink nozzle 20. For instance, the substrate 11 can be etched, starting from the lower surface thereof in the drawing, in order to form the ink chamber 21, and then the diaphragm 16 and the ink nozzle 20 can be formed by processing the substrate 11 itself.

The piezoelectric device 1 is formed by sequentially placing a lower electrode layer 12, the piezoelectric film 13, and an upper electrode layer 14 on an upper surface of the substrate 11 in the drawing. An electric field is applied to the piezoelectric film 13 in a thickness direction thereof by the lower electrode layer 12 and the upper electrode layer 14.

The piezoelectric actuator 2 is in a flexural vibration mode. The lower electrode layer 12 is subjected to patterning along with the piezoelectric film 13 such that the drive voltage can be changed for each ink chamber 21. The piezoelectric device 1 also has a driver 15 that performs drive control for changing the voltage applied to the lower electrode layer 12.

The substrate 11 of the piezoelectric device 1 according to the present embodiment is not particularly limited, and examples of the material of the substrate 11 include silicon, glass, stainless steel (SUS), yttria-stabilized zirconia (YSZ), $SrTiO_3$, alumina, sapphire, and silicon carbide. A laminated substrate, such as an SOI substrate formed by sequentially placing a $SiO_2$ film and a Si active layer on a silicon substrate, can be used as the substrate 11. Furthermore, between the substrate 11 and the lower electrode layer 12, a buffer layer for improving the lattice matching properties or an adhesion layer for enhancing the adhesion between the substrate and the electrode can be arranged.

Examples of the major constituents of the lower electrode layer 12 include, but not limited to, the metals or metal oxides such as Au, Pt, Ir, $IrO_2$, $RuO_2$, $LaNiO_3$, and $SrRuO_3$, and combinations thereof.

Examples of the major constituents of the upper electrode layer 14 include, but not limited to, the examples of the major constituents of the lower electrode layer 12 described above, electrode materials such as Al, Ta, Cr and Cu that are generally used in a semiconductor device, and combinations thereof.

The thicknesses of the lower electrode layer 12 and the upper electrode layer 14 are preferably, but not limited to, 50 nm to 500 nm.

The piezoelectric film 13 has a perovskite structure with (100)-preferred orientation. Here, "with preferred orientation" means a state where the crystals constituting the film are not randomly orientated, but rather particularly oriented in a substantially uniform direction. More specifically, "with (100)-preferred orientation" means that the ratio (100)/((100)+(110)+(111)) in the diffraction intensities of the (100), (110) and (111) planes when the piezoelectric film is measured by wide-angle X-ray diffraction (XRD), is greater than 0.5.

The piezoelectric film 13 is composed of one or more kinds of perovskite oxides represented as:

$$Pb_{1+\delta}[(Zr_xTi_{1-x})_{1-y}Nb_y]O_z,$$

where x is a value in the range of 0<x<1, and y is a value in the range of $0.13 \leq y \leq 0.25$ ($\delta=0$ and $z=3$ are standard, and each value can diverge from the standard value within a range where a perovskite structure is obtained).

Furthermore, in the piezoelectric film 13, the ratio between the diffraction peak intensity I(100) from the perovskite (100) plane and the diffraction peak intensity I(200) from the perovskite (200) plane as measured by X-ray diffraction satisfies $I(100)/I(200) \geq 1.25$.

It is preferable that y is in the range of $0.19 \leq y \leq 0.25$, and $I(100)/(200) \geq 1.29$.

The value of $I(100)/I(200)$ has correlation with an amount of instable Pb ions which are present in the crystals. The smaller the value of $I(100)/I(200)$, the greater the number of Pb ions which obstruct the piezoelectric function in the crystals. Furthermore, if there are a large number of instable Pb ions in the crystals, then this also has an adverse effect on the durability of the piezoelectric device in continuous driving.

Method of Forming Piezoelectric Film

There are no particular restrictions on the method of forming the piezoelectric film 13, and possible examples thereof include: vapor phase epitaxy methods, such as sputtering method, plasma CVD (chemical vapor deposition) method, MOCVD (metal organic chemical vapor deposition) method, and PLD (pulsed laser deposition) method; liquid phase methods, such as sol gelation method and metal organic decomposition method; and aerosol deposition method, and the like. A vapor phase epitaxy method is preferable since the film formation conditions can be changed readily during film formation. Furthermore, by forming a piezoelectric film by vapor phase epitaxy, it is possible to suppress the occurrence of horizontal stripes during film formation, and the piezoelectric film having high durability can be formed.

In the present embodiment, in order to reduce the amount of instable Pb ions in the crystals (in order to raise the value of I(100)/I(200)), the piezoelectric film is formed in such a manner that the energy of ions colliding with the substrate is large.

The manufacture of a piezoelectric film by vapor phase epitaxy can be applied to a film formation apparatus in which a substrate and a target are placed to face each other and a film containing a target constituent element is formed on the substrate by using a plasma. Examples of applicable film formation methods are sputtering methods, such as a bipolar sputtering method, a tripolar sputtering method, a direct-current (DC) sputtering method, a high-frequency (RF) sputtering method, an electron cyclotron resonance (ECR) sputtering method, a magnetron sputtering method, an opposed target sputtering method, a pulsed sputtering method, and an ion beam sputtering method, and the like. Further examples of vapor phase epitaxy methods to which embodiments of the present invention can be applied, apart from sputtering, are an ion plating method, a plasma CVD method, and the like. In the present embodiment, high-frequency sputtering (RF sputtering) method is described by way of an example.

Figure 2:
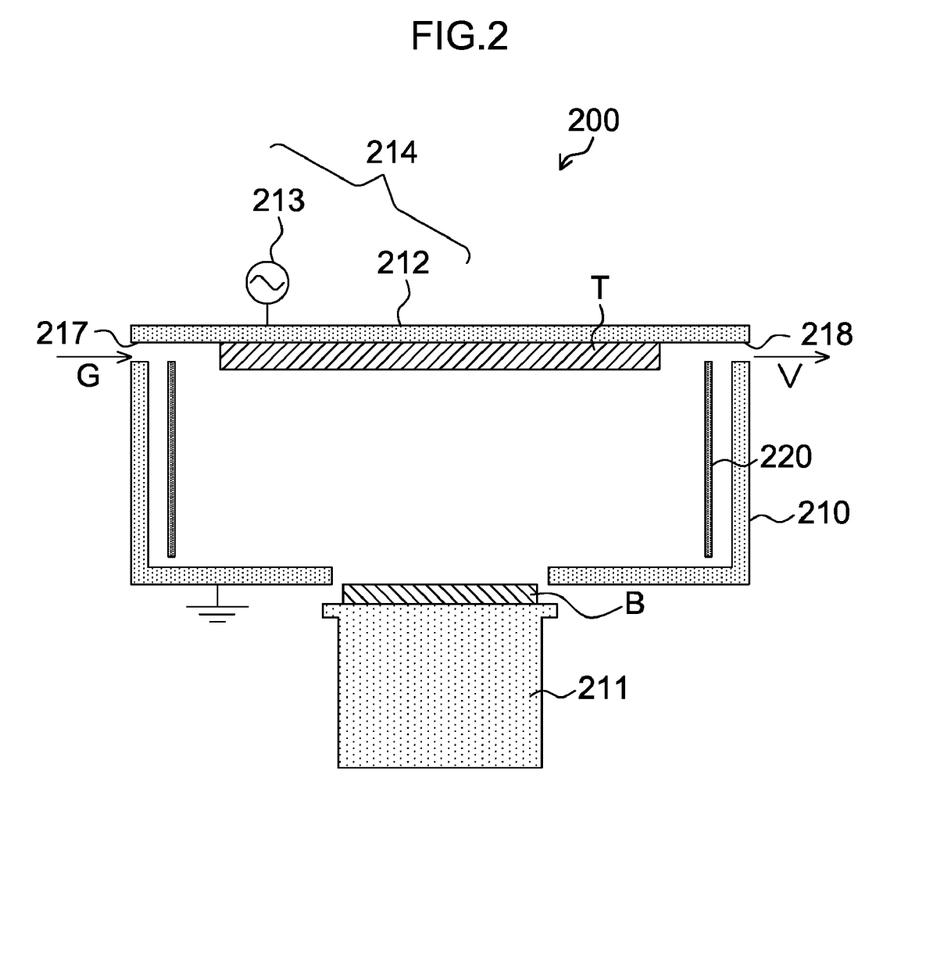
FIG. 2 is a diagram showing a manufacturing apparatus which manufactures a piezoelectric film according to an embodiment of the present invention.

FIG. 2 shows a manufacturing apparatus configured to manufacture a piezoelectric film according to an embodiment of the present invention. The film formation apparatus (high-frequency sputtering apparatus) 200 shown in FIG. 2 includes: a substrate holder 211, in which a substrate B can be installed and which can heat the installed substrate B to a prescribed temperature; and a vacuum vessel 210, which is provided with a target holder 212, in which a target T can be installed. In the film formation apparatus 200 shown in FIG. 2, the vacuum vessel 210 is a film formation chamber.

The substrate holder 211 and the target holder 212 are disposed to separately face each other inside the vacuum vessel 210. The target holder 212 is connected to a high-frequency (RF) power source 213, which is arranged to the outside of the vacuum vessel 210, and the target holder 212 forms a plasma power source (cathode electrode) for generating a plasma. In FIG. 2, the high-frequency power source 213 and the target holder 212 which functions as the plasma electrode (cathode electrode) serve as a plasma generating device 214, which generates plasma inside the vacuum vessel 210.

There are no particular restrictions on the substrate B, and it is appropriate to select an Si substrate, an oxide substrate, a glass substrate, various types of flexible substrate, or the like, depending on the application. The composition of the target T is selected in accordance with the composition of the film that is to be formed.

The film formation apparatus 200 is provided with a gas introduction device 217, which introduces gas G for converting to a plasma into the vacuum vessel 210, and a gas discharge device 218, which discharges gas V from the vacuum vessel 210. For the gas it is possible to use Ar or a mixed gas of $Ar/O_2$.

As shown in FIG. 2, floating walls 220 are arranged inside the vacuum vessel 210, and the floating walls 220 are set to a floating potential. By setting the floating walls 220 to the floating potential, the floating walls 220 assume the same potential as the plasma potential, and therefore the plasma component is not liable to reach the inner faces of the vacuum vessel 210 and the ion collision energy on the substrate B can be thereby raised. Consequently, it is possible to arrange Pb ions at the A site of the perovskite structure ($ABO_3$), and to reduce the amount of instable Pb ions in the crystals, and therefore the formed piezoelectric film can yield high piezoelectric performance. Furthermore, since there are few instable Pb ions, it is then possible to raise the ratio (I(100)/I(200)) between the diffraction peak intensities measured by X-ray diffraction.

The ion collision energy on the substrate B is raised by setting the inner walls inside the vacuum vessel 210 to the floating potential in the embodiment shown in FIG. 2; and as another method, it is also possible to control the ion collision energy by reducing the surface area of the anode inside the vacuum vessel 210 or by changing the impedance of the substrate B by coating with an insulator.

In the present embodiment, the B site element in the perovskite structure of the lead zirconate titanate is substituted with Nb in part, thereby improving the piezoelectric performance; however, if Nb is added in a high ratio of 13% or more, then another phase known as the pyrochlore structure which has no piezoelectric performance is liable to occur. Furthermore, since Nb is introduced into the perovskite crystals in pentavalent form, then if the doping amount of Nb is increased, charge neutrality cannot be established, and the number of instable Pb atoms tends to increase further. Therefore, if Nb is doped to 13% or more, it is necessary to apply high energy to incoming Pb ions during film formation. As described above, by using the piezoelectric film manufacturing apparatus 200 illustrated in FIG. 2, it is possible to raise the ion energy, and therefore a piezoelectric film having high piezoelectric performance can be manufactured.

It is preferable that the crystalline phases of the thus formed piezoelectric film include a rhombohedral phase. Furthermore, it is preferable that the thus formed piezoelectric film is a columnar crystal structure film constituted of many columnar crystals extending in the thickness direction of the piezoelectric film. By forming the columnar crystalline structure, it is possible to form the piezoelectric film having a large thickness. It is preferable that the thickness of the piezoelectric film is not smaller than 2 μm and not larger than 20 μm. Making the piezoelectric film thick can provide high durability. Furthermore, the average grain size of the columnar crystals constituting the piezoelectric film is preferably, but not limited to, not smaller than 30 nm and not larger than 1 μm. If the average grain size of the columnar crystals is too small, then the effects of the domain interface portions on the dielectric properties become large, and desired piezoelectric performance might not be accomplished. If the average grain size of the columnar crystals is too large, on the other hand, the accuracy of the shape obtained after patterning might be lowered.

Furthermore, the piezoelectric constant $d_{31}$ of the piezoelectric film is desirably no less than 220 pm/V, and more desirably no less than 250 pm/V. By setting the piezoelectric constant $d_{31}$ to the aforementioned range, the piezoelectric film can be used suitably in a piezoelectric device and an inkjet recording head (liquid ejection apparatus).

Inkjet Recording Apparatus

Figure 3:
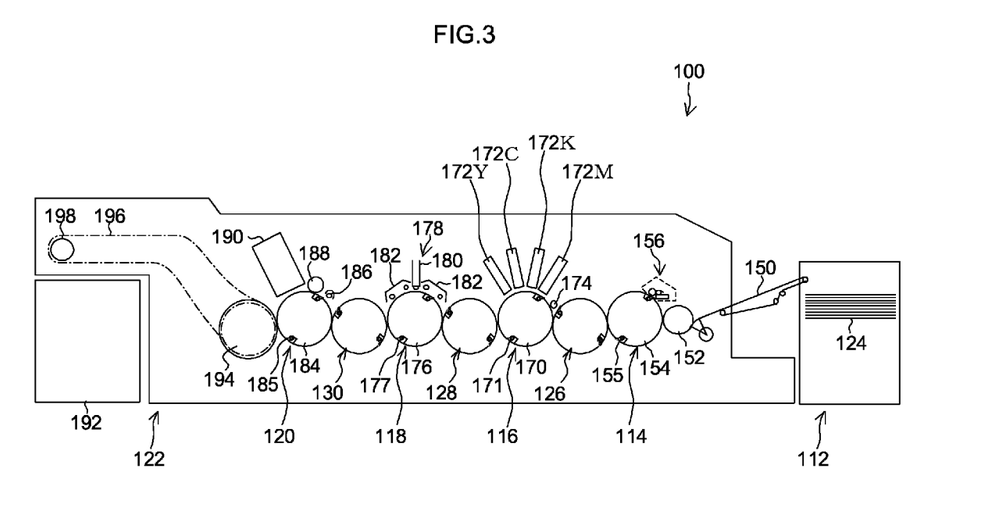
FIG. 3 is a schematic drawing showing a general view of an inkjet recording apparatus.

A configuration of an inkjet recording apparatus with the inkjet recording heads 3 (172M, 172K, 172C and 172Y) according to the embodiment of the present invention is described with reference to FIG. 3. FIG. 3 is a diagram showing the entire apparatus.

The inkjet recording apparatus 100 is of a direct-drawing type that forms a desired color image by depositing ink droplets of a plurality of colors from inkjet heads 172M, 172K, 172C and 172Y onto a recording medium 124 (often referred to as a "sheet" for convenience) that is held on a pressure drum (a drawing drum 170) of a drawing unit 116. The inkjet recording apparatus 100 is an on-demand type image forming apparatus employing a two-liquid reaction (aggregation) system for applying treatment liquid (aggregation treatment liquid) to the recording medium 124 prior to depositing the ink droplets, and then making the treatment liquid react with the ink droplets to form an image on the recording medium 124.

As shown in FIG. 3, the inkjet recording apparatus 100 mainly has a sheet feeding unit 112, a treatment liquid application unit 114, the drawing unit 116, a drying unit 118, a fixing unit 120, and a discharge unit 122.

<Sheet Feeding Unit>

The sheet feeding unit 112 is a mechanism for supplying the recording media 124 to the treatment liquid application unit 114. The recording media 124, sheets of paper, are stacked on the sheet feeding unit 112. The sheet feeding unit 112 is provided with a sheet tray 150 from which the recording media 124 are supplied, one by one, to the treatment liquid application unit 114.

<Treatment Liquid Application Unit>

The treatment liquid application unit 114 is a mechanism for applying the treatment liquid to a recording surface of the recording medium 124. The treatment liquid contains a color material aggregating agent for aggregating color materials (pigments in the present embodiment) of the ink deposited by the drawing unit 116. Contact between the treatment liquid and the ink facilitates separation of the ink into the color materials and solvent.

The recording medium 124, applied with the treatment liquid in the treatment liquid application unit 114, is delivered from the treatment liquid drum 154 to the drawing drum 170 of the drawing unit 116 through an intermediate conveying unit 126.

<Drawing Unit>

The drawing unit 116 has the drawing drum (the second conveying body) 170, a sheet pressing roller 174, and the inkjet recording heads 172M, 172K, 172C and 172Y.

Each of the inkjet recording heads 172M, 172K, 172C and 172Y is preferably a full-line type inkjet recording head (inkjet head), the length of which corresponds to the maximum width of an image forming region on the recording medium 124. An ink ejection surface of each of the inkjet recording heads 172M, 172K, 172C and 172Y has a nozzle row in which a plurality of ink ejection nozzles are arranged over the entire width of the image forming region. Each of the inkjet recording heads 172M, 172K, 172C and 172Y is installed so as to extend in a direction perpendicular to a conveyance direction of the recording medium 124 (a rotation direction of the drawing drum 170).

The inkjet recording heads 172M, 172K, 172C and 172Y eject ink droplets of the corresponding colors to the recording surface of the recording medium 124 tightly held on the drawing drum 170. As a result, the ink droplets come into contact with the treatment liquid that has been applied to the recording surface in the treatment liquid application unit 114, and consequently the color materials (pigments) dispersed within the ink are aggregated, forming a color material aggregate. This prevents the color materials from flowing on the recording medium 124, and an image is formed on the recording surface of the recording medium 124.

The recording medium 124 on which the image has been formed in the drawing unit 116 is then delivered from the drawing drum 170 to a drying drum 176 of the drying unit 118 through an intermediate conveying unit 128.

<Drying Unit>

The drying unit 118 is a mechanism for drying the moisture contained in the solvent separated by the color material aggregating action. As shown in FIG. 3, the drying unit 118 has the drying drum (conveying body) 176 and a solvent drying device 178.

The solvent drying device 178, disposed so as to face an outer circumference of the drying drum 176, is constituted of IR (infrared) heaters 182 and a warm air jet nozzle 180 disposed between the IR heaters 182.

The recording medium 124 that has been subjected to the drying process in the drying unit 118 is delivered from the drying drum 176 to a fixing drum 184 of the fixing unit 120 through an intermediate conveying unit 130.

<Fixing Unit>

The fixing unit 120 is constituted of the fixing drum 184, a halogen heater 186, a fixing roller 188, and an in-line sensor 190. When the fixing drum 184 rotates, the recording medium 124 is conveyed with its recording surface facing outward, and the recording surface is then preheated by the halogen heater 186, fixed by the fixing roller 188, and inspected by the in-line sensor 190.

The fixing roller 188 is a roller member that adheres self-dispersible thermoplastic resin particles in the dried ink to each other by applying heat and pressure to the dried ink, in order to form the ink into a film. The fixing roller 188 is configured to apply heat and pressure to the recording medium 124.

According to the fixing unit 120 having the composition described above, the thermoplastic resin particles in the thin image layer formed by the drying unit 118 are heated, pressed and melted by the fixing roller 188, and hence the image layer can be fixed to the recording medium 124.

Moreover, in cases where the ink contains ultraviolet-curable monomer, it possible to improve the strength of the image by irradiating ultraviolet light onto the image in a fixing unit having an ultraviolet irradiation lamp, after the water has been evaporated off sufficiently in the drying unit, thereby curing and polymerizing the ultraviolet-curable monomer.

<Discharge Unit>

The discharge unit 122 is arranged following the fixing unit 120. The discharge unit 122 has a discharge tray 192. Between the discharge tray 192 and the fixing drum 184 of the fixing unit 120 there are arranged a delivery drum 194, conveying belt 196, and stretching roller 198 so as to face the discharge tray 192 and the fixing drum 184. The recording medium 124 is fed to the conveying belt 196 by the delivery drum 194 and then discharged to the discharge tray 192.

Although FIG. 3 illustrates the drum conveyance type inkjet recording apparatus, the present invention is not limited thereto and can also be used in a belt conveyance type inkjet recording apparatus and the like.

EXAMPLES

The present invention is described in further detail using examples below; however, the present invention is not limited thereto.

Practical Example 1

Using a commercial sputtering apparatus in which a target having the diameter of 300 mm was loaded, the lateral faces of the film formation chamber were set to the floating potential as described with reference to FIG. 2. The substrate was connected to an LCR circuit capable of varying impedance, it was then possible to change the value of Vsub (the substrate potential) during film formation by changing the impedance of the substrate.

RF sputtering at 3 kW was carried out using a target of $Pb_{1.3}(Zr_{0.42}Ti_{0.39}Nb_{0.19})O_3$, to manufacture a PZT thin film (piezoelectric film). The film formation temperature was set to 500° C. The substrate used was an SOI substrate processed by silicon RIE etching to fabricate a diaphragm structure, on which an Ir lower electrode was vapor deposited by sputtering.

Figure 5:
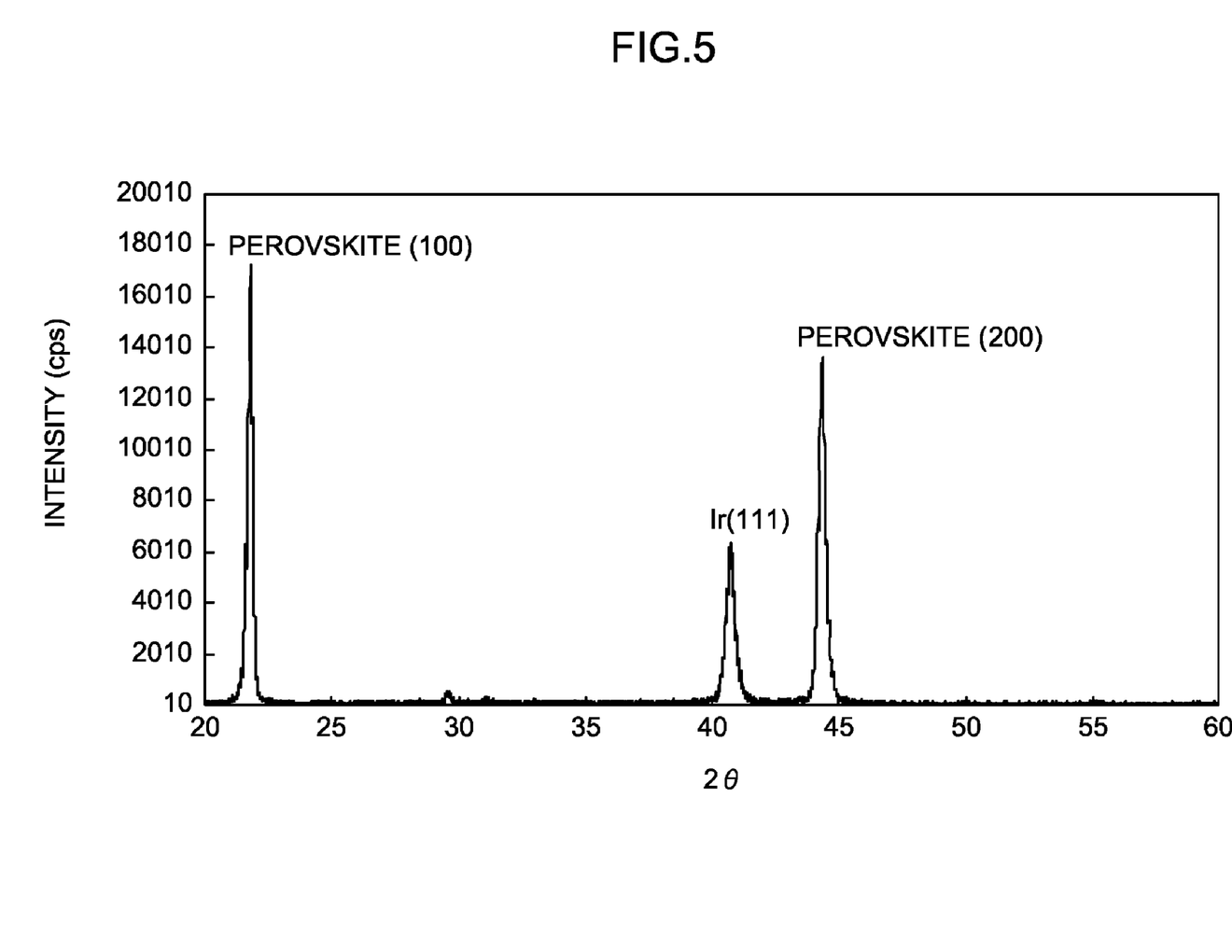
FIG. 5 is an XRD pattern of a piezoelectric film manufactured in Practical Example 1.

FIG. 5 shows an XRD pattern of the thin film thus obtained. The film had a (100) single orientation, and the value of intensity ratio of the I(100)/I(200) peaks was found to be 1.29. Furthermore, the permittivity $\in$ was found from Cp, the piezoelectric constant $d_{31}$ was found from the amount of displacement of the diaphragm, and the values were $\in=1280$ and $d_{31}=310$. These results are shown in a table in FIG. 6.

Practical Example 2

A PZT thin film was manufactured under similar conditions to Practical Example 1, apart from the fact that a target used was PZT doped with 20% of Nb at the B site while adjusting a composition ratio of zirconium and titanium at Zr:Ti=52:48. In each of the Practical Examples and Comparative Examples described below, the composition ratio of zirconium and titanium was fixed at Zr:Ti=52:48, regardless of the doping amount of Nb.

Practical Example 3

Figure 7:
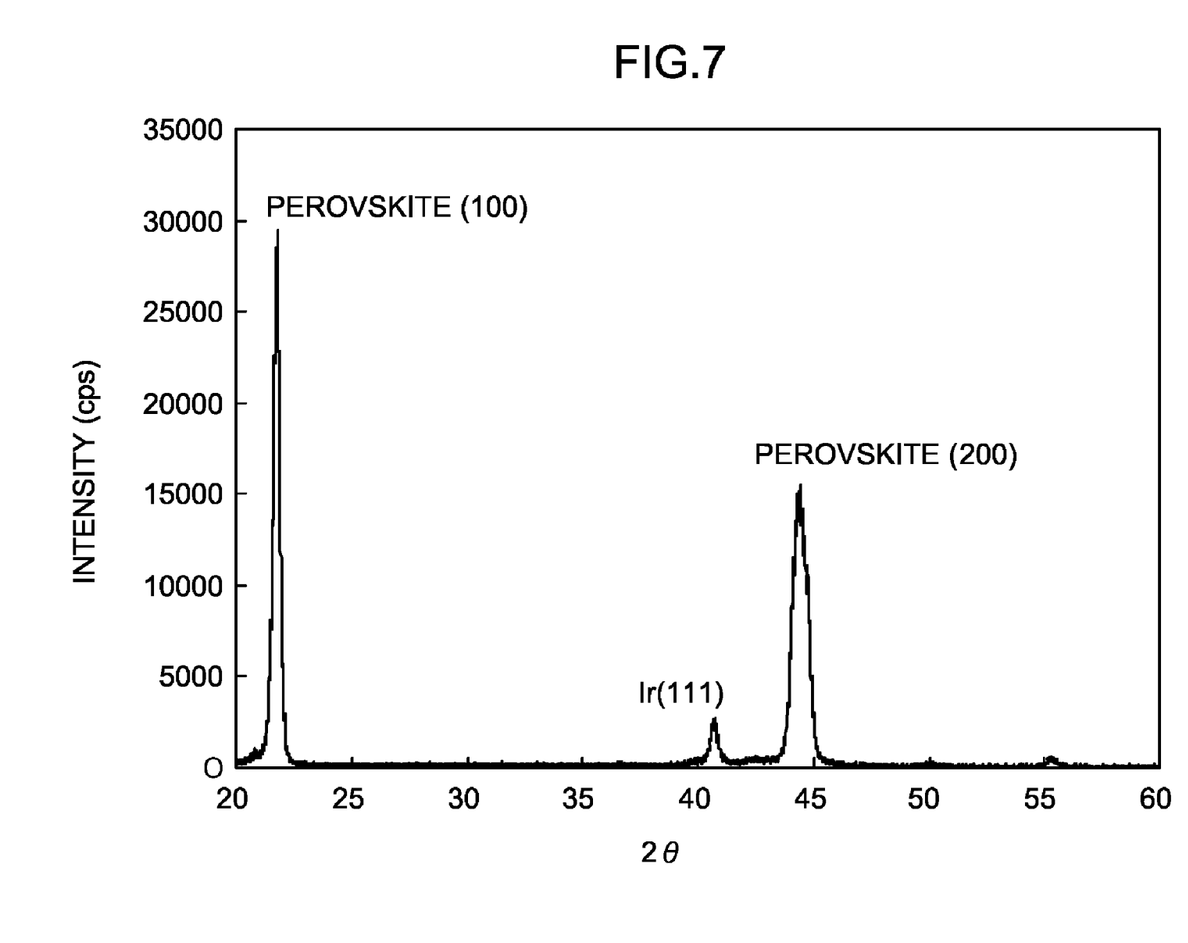
FIG. 7 is an XRD pattern of a piezoelectric film manufactured in Practical Example 3.

A PZT thin film was manufactured under similar conditions to Practical Example 1, apart from the fact that PZT doped with 12.5% of Nb at the B site was used as a target. FIG. 7 shows an XRD pattern of the thin film obtained in Practical Example 3.

Practical Example 4

A PZT thin film was manufactured under similar conditions to Practical Example 1, apart from the fact that PZT doped with 13% of Nb at the B site was used as a target.

Comparative Example 1

A PZT thin film was manufactured under similar conditions to Practical Example 1, apart from the fact that PZT doped with 10% of Nb at the B site was used as a target.

Comparative Example 2

Figure 4:
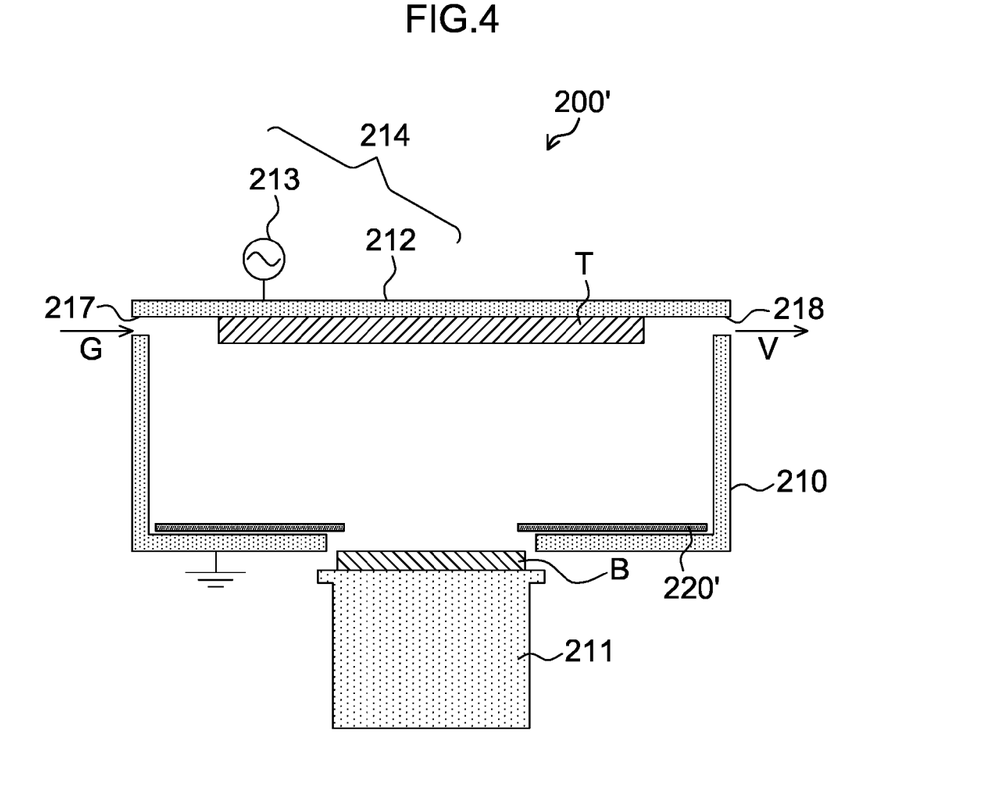
FIG. 4 is a diagram showing a manufacturing apparatus which manufactures a piezoelectric film in Comparative Example 2.

Using a commercial sputtering apparatus in which a target having the diameter of 300 mm was loaded, the lateral faces of the film formation chamber were set to a ground potential as shown in FIG. 4, and the chamber walls at the periphery of the substrate were set to a floating potential. A film was formed by RF sputtering under similar film formation conditions to Practical Example 1, apart from the fact that PZT doped with 20% of Nb at the B site was used as a target.

Figure 8:
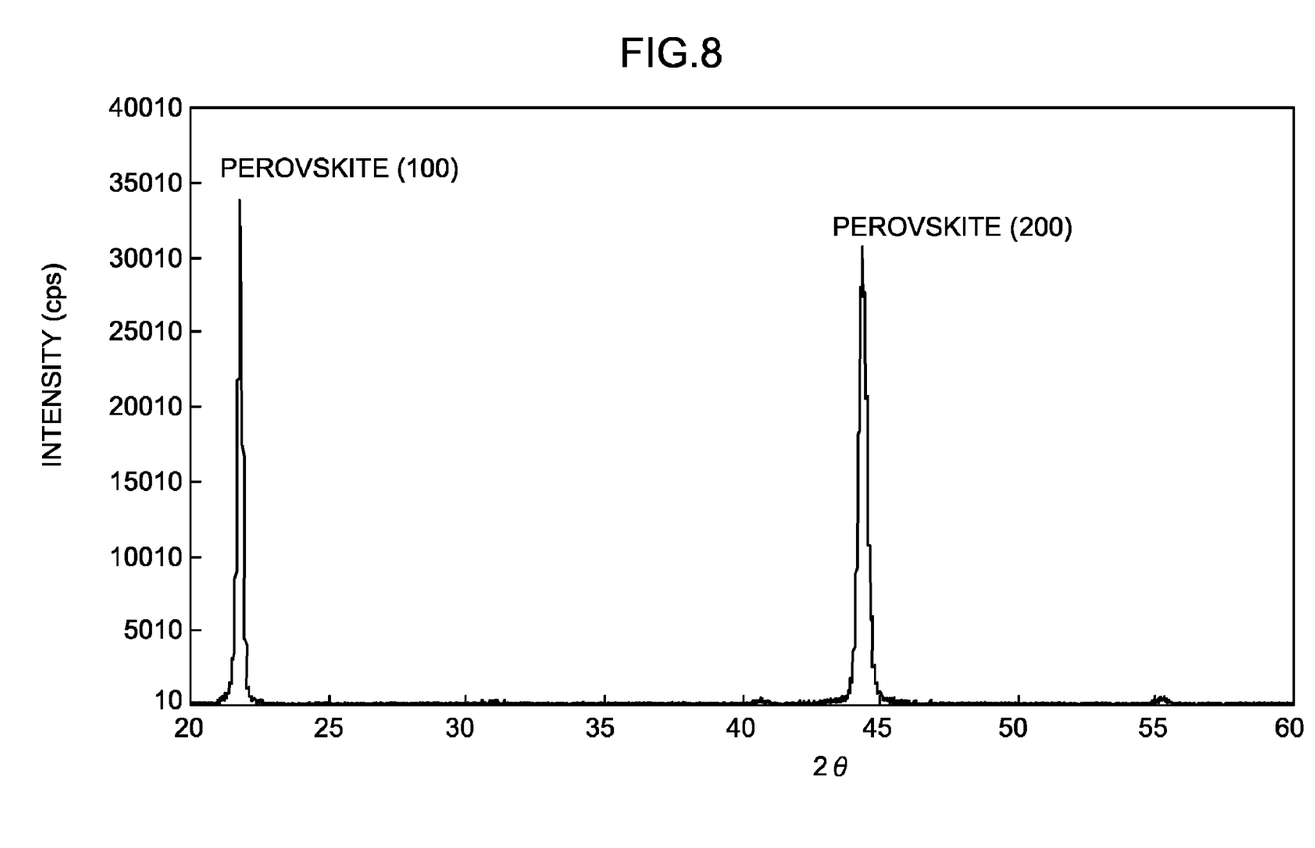
FIG. 8 is an XRD pattern of a piezoelectric film manufactured in Comparative Example 2.

FIG. 8 shows an XRD pattern of the thin film thus obtained. The value of intensity ratio of the I(100)/I(200) peaks the obtained film was found to be 1.071. Furthermore, the permittivity $\in$ and the piezoelectric constant $d_{31}$ were found to be $\in=992.8$ and $d_{31}=210$.

If the lateral faces of the film formation chamber are set to the ground potential and the chamber walls at the periphery of the substrate are the floating walls 220' set to the floating potential, as in the film formation apparatus shown in FIG. 4, then an electric field having a strong DC component is generated toward the lateral faces of the film formation chamber in FIG. 4, and the electric field directed toward the bottom face of the film formation chamber, in other words, the substrate B, becomes weak. Consequently, the ion collision energy is low and the piezoelectric performance is expected to be low.

Comparative Example 3

A PZT thin film was manufactured with the similar apparatus under the similar film formation conditions to Comparative Example 2, apart from the fact that PZT doped with 17% of Nb at the B site was used as a target.

Comparative Example 4

A PZT thin film was manufactured with the similar apparatus under the similar film formation conditions to Practical Example 1, apart from the fact that PZT doped with 9% of Nb at the B site was used as a target.

Comparative Example 5

A PZT thin film was manufactured with the similar apparatus under the similar film formation conditions to Practical Example 1, apart from the fact that PZT doped with 6.5% of Nb at the B site was used as a target.

Comparative Example 6

A PZT thin film was manufactured with the similar apparatus under the similar film formation conditions to Practical Example 1, apart from the fact that $Pb_{1.3}(Zr_{0.52}Ti_{0.48})O_3$ was used as a target.

Comparative Example 7

A PZT thin film was manufactured with the similar apparatus under the similar film formation conditions to Comparative Example 2, apart from the fact that PZT doped with 13% of Nb at the B site was used as a target.

<Results>

Figure 6:
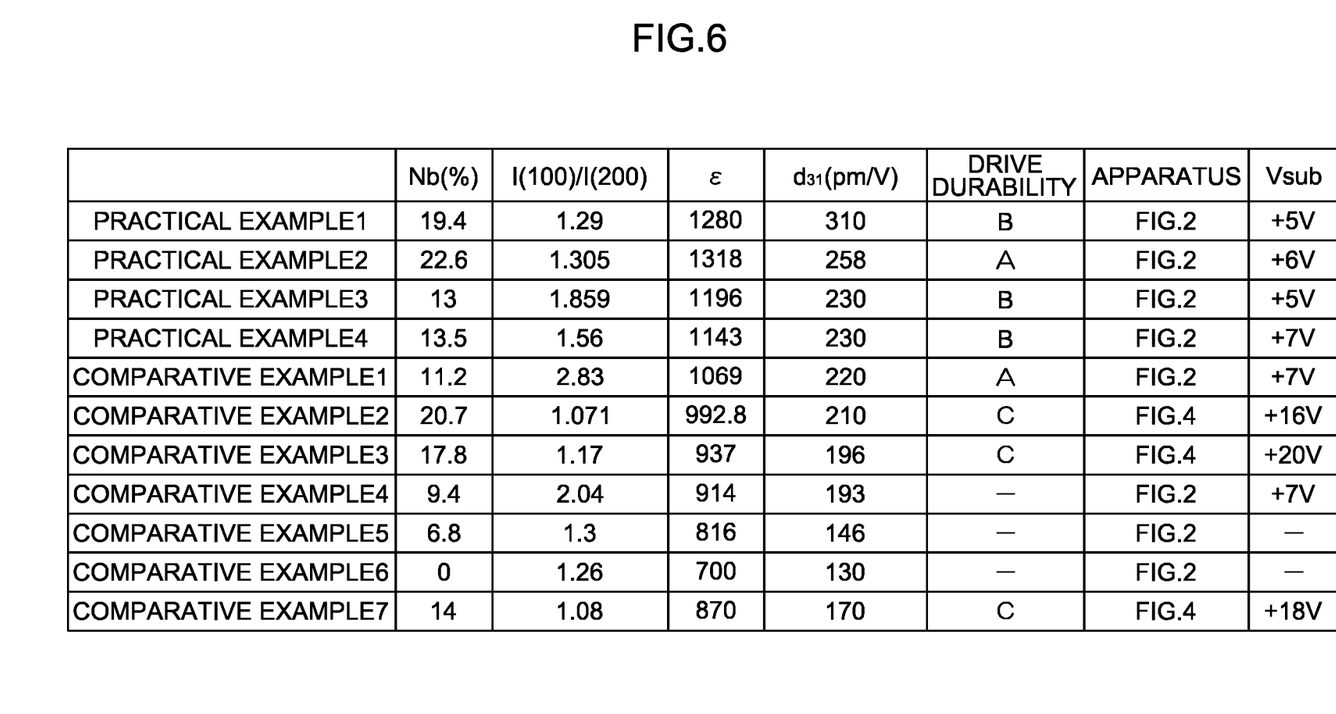
FIG. 6 is a table showing the results of experiments in Examples.
Figure 9:
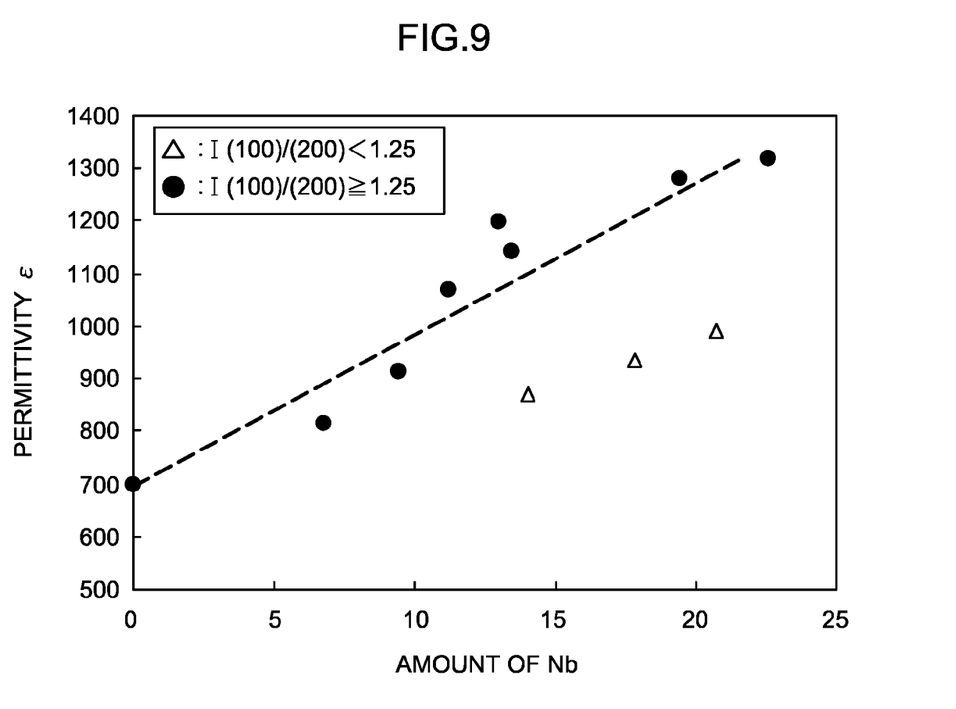
FIG. 9 is a graph showing the relationship between the Nb doping amount and the permittivity $\in$ in Examples.
Figure 10:
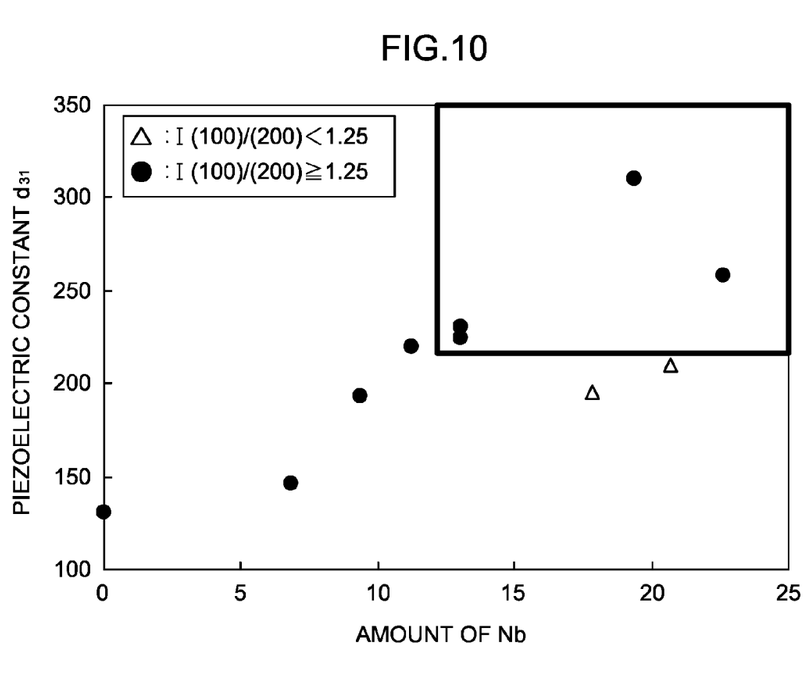
FIG. 10 is a graph showing the relationship between the Nb doping amount and the piezoelectric constant $d_{31}$ in Examples.

The corresponding results are shown in FIG. 6. FIG. 9 shows the relationship between the added amount of Nb and the permittivity $\in$, and FIG. 10 shows the relationship between the added amount of Nb and the piezoelectric constant $d_{31}$. The drive durability was judged on the basis of the criteria indicated below, depending on the number of times dielectric breakdown or degraded displacement occurred when the piezoelectric device was continuously driven by applying a 100 kHz sinusoidal wave of 25 Vp-p and offset voltage of −12.5 V, under conditions of 40° C. temperature and 80% relative humidity:

A: Drive durability$\geqq 1\times 10^{11}$ cycles;
B: $1\times 10^{11}$ cycles>Drive durability$\geqq 1\times 10^9$ cycles; and
C: $1\times 10^9$ cycles>Drive durability.

No experiments into drive durability were carried out for Comparative Examples 4 to 6, due to the low values of the permittivity ∈ and piezoelectric constant $d_{31}$. Moreover, no measurement of Vsub was made in Comparative Examples 5 and 6.

From FIGS. 6, 9 and 10, it was seen that the piezoelectric characteristics and the dielectric characteristics tended to improve with Nb doping at the B site. However, it was confirmed that if I(100)/I(200)<1.25, then the characteristics declined suddenly and sufficient characteristics were not obtained. From these results, it can be confirmed that in order to obtain sufficient piezoelectric performance in application to an inkjet head, or the like, it is necessary to satisfy Nb≧13%, I(100)/I(200)≧1.25, which is the range indicated with the bold frame in FIG. 10.

By setting the chamber wall faces of the sputtering apparatus to the floating potential and setting the periphery of the substrate to the ground potential as shown in FIG. 2, it is possible to strengthen the collision energy of the ions onto the substrate, and the amount of instable Pb ions in the crystal can be reduced, which means that the characteristics can be improved. On the other hand, if the chamber wall faces are set to the ground potential and the periphery of the substrate is set to the floating potential as shown in FIG. 4, then the plasma becomes soft, and it is not possible to achieve energy that enables sufficient migration of Pb into the substrate. Hence, Pb ions which are instable and do not contribute to piezoelectric effects occur in the crystals, and the characteristics decline. The results of the examples revealed that, by setting the substrate potential Vsub to +10V or lower, it is possible to raise the potential difference with respect to the plasma potential, and therefore, the ion energy can be raised.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A piezoelectric film comprising crystals of a complex oxide having a perovskite structure with (100)-preferred orientation and represented as:

$$Pb_{1+\delta}[(Zr_xTi_{1-x})_{1-y}Nb_y]O_z,$$

where x is a value in a range of 0<x<1, y is a value in a range of 0.13≦y≦0.25, and δ and z are values within ranges where the perovskite structure is obtained and δ=0 and z=3 are standard,
wherein a ratio between a diffraction peak intensity I(100) from a perovskite (100) plane and a diffraction peak intensity I(200) from a perovskite (200) plane as measured by X-ray diffraction satisfies I(100)/I(200)≧1.25.

2. The piezoelectric film as defined in claim 1, wherein the ratio between the diffraction peak intensity I(100) and the diffraction peak intensity I(200) satisfies I(100)/I(200) ≧1.29.

3. The piezoelectric film as defined in claim 2, wherein y is in a range of 0.19≦y≦0.25.

4. The piezoelectric film as defined in claim 1, wherein crystalline phases of the piezoelectric film include a rhombohedral phase.

5. The piezoelectric film as defined in claim 1, wherein a thickness of the piezoelectric film is not smaller than 2 μm.

6. The piezoelectric film as defined in claim 1, wherein the piezoelectric film has a piezoelectric constant $d_{31}$ of not smaller than 220 pm/V.

7. The piezoelectric film as defined in claim 6, wherein the piezoelectric film has the piezoelectric constant $d_{31}$ of not smaller than 250 pm/V.

8. The piezoelectric film as defined in claim 1, wherein the piezoelectric film has a columnar crystal structure extending in a thickness direction of the piezoelectric film.

9. The piezoelectric film as defined in claim 1, wherein the piezoelectric film is formed by a sputtering process.

10. A piezoelectric device, comprising:
   the piezoelectric film as defined in claim 1; and
   electrodes through which an electric field is applied to the piezoelectric film.

* * * * *